United States Patent
Smith et al.

(10) Patent No.: US 10,012,551 B2
(45) Date of Patent: Jul. 3, 2018

(54) DOWNHOLE MEASUREMENT SENSOR ASSEMBLY FOR AN ELECTRICAL SUBMERSIBLE PUMP AND METHOD OF MANUFACTURING THEREOF

(71) Applicant: Automation Solutions Inc., Bartlesville, OK (US)

(72) Inventors: Alistair G. Smith, Bartlesville, OK (US); Dennis Miles, Jr., Lincoln, AR (US)

(73) Assignee: AUTOMATION SOLUTIONS INC., Bartlesville, OK (US)

( * ) Notice: Subject to any disclaimer, the term of this patent is extended or adjusted under 35 U.S.C. 154(b) by 531 days.

(21) Appl. No.: 14/692,410

(22) Filed: Apr. 21, 2015

(65) Prior Publication Data

US 2016/0313192 A1    Oct. 27, 2016

(51) Int. Cl.
*G01K 7/18*  (2006.01)
*G01K 13/00* (2006.01)
(Continued)

(52) U.S. Cl.
CPC ............... *G01K 13/00* (2013.01); *G01K 1/08* (2013.01); *G01K 7/18* (2013.01); *G01V 9/005* (2013.01); *H05K 3/303* (2013.01)

(58) Field of Classification Search
CPC ............ G01K 7/02; G01K 3/005; G01K 3/10; G01K 7/42; G01K 7/22; G01K 7/16; G01K 7/01; G01K 7/10; G01K 11/32; G01K 13/00; G01K 13/02; G01K 2205/04; G01K 2013/024; H01R 4/023; H01R 4/029; H01R 43/28; B23K 31/02; G01F 1/00; G01N 25/72; G01N 25/28; G01N 25/32; G01N 33/225; G01N 33/02; H05K 7/20945; F24F 11/0012; F24F 2001/0052; F24F 2011/0093; F24F 11/022; H02M 1/32; H02M 1/38; H02M 1/53806; H01C 7/008; H01C 17/00; G01R 31/2642;
(Continued)

(56) References Cited

U.S. PATENT DOCUMENTS 4,937,552 A * 6/1990 Lam .................. G01K 1/18
                                                        338/25
5,415,037 A * 5/1995 Griston ............. E21B 47/065
                                                      73/152.12
(Continued)

*Primary Examiner* — Manish S Shah
(74) *Attorney, Agent, or Firm* — Crowe & Dunlevy, P.C.

(57) ABSTRACT

The invention relates to a downhole measurement sensor assembly for an electrical submersible pump that is housed within a rugged, insulated and durable enclosure. The downhole measurement sensor assembly can be manufactured in accordance with the method described herein. The sensor assembly is configured to be inserted into a windings area of a downhole motor of the electrical submersible pump. The sensor assembly includes insulated lead wires that are connected to a thin-film temperature sensing element for monitoring the ESP motor operating temperature. The thin-film sensing element includes thin lead wires that are electrically connected via a connection substrate to the insulated lead wires. The thin-film sensing element is mounted the connection member, and the connection member may include attachment apertures for connecting the insulated lead wires.

10 Claims, 1 Drawing Sheet

(51) Int. Cl.
*H05K 3/30* (2006.01)
*G01V 9/00* (2006.01)
*G01K 1/08* (2006.01)

(58) Field of Classification Search
CPC ....... G01R 31/048; G01R 31/40; G01J 5/004; G01J 5/043; G01J 5/0821; A47J 43/287; F16B 2/02; F16B 1/00; F16B 47/00; F16B 2001/0035; F16M 13/02; F16M 13/022
See application file for complete search history.

(56) References Cited

U.S. PATENT DOCUMENTS

| | | | | |
|---|---|---|---|---|
| 5,674,009 A | * | 10/1997 | Stark | G01K 1/08 374/209 |
| 5,726,624 A | * | 3/1998 | Caffee | G01K 7/183 374/E7.022 |
| 6,354,736 B1 | * | 3/2002 | Cole | G01K 7/183 374/E7.022 |
| 6,666,578 B2 | | 12/2003 | Gibbs et al. | |
| 7,495,542 B2 | * | 2/2009 | Saio | G01K 1/026 338/25 |
| 7,507,024 B2 | * | 3/2009 | Takahashi | G01K 1/08 374/148 |
| 7,982,586 B2 | | 7/2011 | Ovard et al. | |
| 8,497,759 B2 | | 7/2013 | Kurtz et al. | |
| 8,668,385 B2 | * | 3/2014 | Matsuo | G01K 1/08 374/148 |
| 2006/0209920 A1 | * | 9/2006 | Kamiyama | G01K 7/42 374/29 |
| 2007/0195857 A1 | * | 8/2007 | Krishnamurthy | G01K 1/16 374/148 |
| 2010/0047089 A1 | * | 2/2010 | Booker | G01K 13/08 374/141 |
| 2010/0066482 A1 | * | 3/2010 | Shiko | G01K 7/223 338/22 R |
| 2012/0026659 A1 | * | 2/2012 | Kim | G01K 1/08 361/679.01 |
| 2012/0063488 A1 | * | 3/2012 | Nakayama | G01K 1/10 374/185 |
| 2012/0195344 A1 | * | 8/2012 | Bernier | G01K 1/08 374/165 |

\* cited by examiner

DOWNHOLE MEASUREMENT SENSOR ASSEMBLY FOR AN ELECTRICAL SUBMERSIBLE PUMP AND METHOD OF MANUFACTURING THEREOF

CROSS REFERENCE TO RELATED APPLICATIONS

Not Applicable.

STATEMENT REGARDING FEDERALLY SPONSORED RESEARCH OR DEVELOPMENT

Not Applicable.

NAMES OF THE PARTIES TO A JOINT RESEARCH AGREEMENT

Not Applicable.

REFERENCE TO A SEQUENCE LISTING, A TABLE, OR A COMPUTER PROGRAM LISTING APPENDIX

Not Applicable.

STATEMENT REGARDING PRIOR DISCLOSURES BY THE INVENTOR OR A JOINT INVENTOR

Not Applicable.

BACKGROUND OF THE INVENTION

1. Field of the Invention

This invention relates generally to a downhole measurement sensor assembly for an electrical submersible pump and method of manufacturing thereof, and more particular to a downhole measurement sensor assembly having a thin-film sensing element mounted to a rigid substrate and housed within a rugged, insulated and durable enclosure that is easily assembled and configured to be inserted into a windings area of a downhole motor of the electrical submersible pump.

2. Description of the Related Art

Various types of downhole equipment, such as pumps and similar devices, are used to move fluids from beneath the surface of the earth to the surface. Well known applications include oil and gas wells and water wells. A typical downhole arrangement would include a string composed of a series of tubes or tubing suspended from the surface. One type of well-known pump is a downhole electrical submersible pump (ESP). The ESP either includes or is connected to a downhole motor which is sealed so that the whole assembly is submerged in the fluid to be pumped. The downhole motor is connected to a three-phase power source at the surface and operates beneath the level of fluid downhole in order to pump the fluid to the surface.

A long power cable from the surface equipment (~500 to 15,000 feet) generally provides power to the ESP and one or more downhole measurement sensors. The downhole measurement sensors are coupled to the ESP and used to monitor certain downhole parameters, such as pressure and temperature, of a subterranean bore-hole. The downhole measurement sensors generally include a sensing element that may utilize the substantially linear relationship of resistance and the particular downhole parameter in order to monitor the bore-hole conditions.

One type of downhole measurement sensor for monitoring downhole temperatures is a resistance temperature device (RTD) probe. RTD probes generally include a sensing element having a substantially linear relationship of resistance and temperature, thereby allowing the ESP motor temperature to be readily monitored by the circuitry in the RTD probe. RTD probes are physically deployed in the motor windings of the ESP motor, and monitor the temperature of the motor windings or motor oil in order to detect an impending motor failure due to abnormally high operating temperatures of the ESP motor.

In order to obtain relevant temperature readings from the winding area of the ESP motor, the RTD probe must be directly inserted into the motor oil within the small motor winding area. In addition, the RTD probe must be constructed to withstand high pressure, since the motor oil is typically at a pressure approximately equal to the well bore pressure, e.g., up to about 8000 psi. Moreover, because the RTD probe is positioned adjacent to the motor windings that carry high voltage and current, the probe must be electrically isolated in a non-metallic enclosure.

Many of the commercially available RTD probe assemblies consist of either a wire-wound element or a thin-film element placed inside a stainless steel sheath enclosure that is sealed on one end and with wires protruding from the other end. The inside of the enclosure is potted or sealed with a thermally conductive compound. For some probes, the combination of the stainless steel sheath enclosure and the space for the potting compound results in the RTD probe being physically too large to insert into the motor windings.

Another approach has been to utilize an RTD probe consisting of just the thin-film element placed inside a thin-wall thermoplastic polymer (polytetrafluoroethylene) sleeve, and having two insulated lead wires bonded to the leads of the thin-film RTD element. The construction of this RTD probe, however, involves connecting the insulated lead wires to the very small fragile lead wires of the thin-film sensing element. This causes difficulty in the manufacturing process, and also allows the RTD probe to be easily damaged during assembly or usage by breaking one of the connections of the lead wire to the thin-film sensing element.

It is therefore desirable to provide an improved downhole measurement sensor assembly for an electrical submersible pump and method of manufacturing thereof.

It is further desirable to provide a downhole measurement sensor assembly housed within a rugged, insulated and durable enclosure that is easily assembled and is configured to be inserted into a windings area of a downhole motor of the electrical submersible pump.

It is still further desirable to provide a method of manufacturing a downhole measurement sensor assembly by mounting a thin-film sensing element to a rigid substrate, connecting the leads of the thin-film sensing element to insulated lead wires of the downhole measurement sensor assembly, and housing the constructed sensor assembly in a rugged, insulated and durable enclosure.

It is therefore desirable to provide a downhole temperature sensor assembly having increased durability during assembly with independent connection points on a connection member between the leads of a thin-film temperature sensing element and insulated lead wires of the sensor.

Other advantages and features of the invention will be apparent from the following description and from the claims.

BRIEF SUMMARY OF THE INVENTION

In general, in a first aspect, the invention relates to a downhole measurement sensor assembly configured to be inserted into a windings area of a downhole motor for an electrical submersible pump. The sensor assembly includes a thin-film sensing element having a pair of thin lead wires and a pair of insulated lead wires. A rigid substrate or connection member is electrically connected to the thin lead wires of the thin-film sensing element and to the insulated lead wires. A rugged, insulated and durable enclosure houses the sensing element, an end of the insulated lead wires and the rigid connection member. The enclosure is constructed from a polymer material, such as a high-temperature rated, insulated, heat shrinkable polymer material, namely polytetrafluoroethylene. The rigid connection member may be a printed circuit board, with the sensing element mounted thereon. The sensing element may be a thin-film resistance temperature sensing element that has a nominal resistance of about 1000 ohm at 0° C.

In general, in a second aspect, the invention relates to a thin-film resistance temperature sensing device. The sensing device has a thin-film temperature sensing element with a substantially linear relationship of resistance and temperature. In this aspect, the sensing element is mounted to a printed circuit board, and the sensing element has thin lead wires electrically connected to the printed circuit board. In addition, the printed circuit board has attachment apertures that are electrically connected to insulated lead wires of the sensing device. An enclosure constructed of a high-temperature rated polymer material houses the sensing device.

In general, in a third aspect, the invention relates to a method of manufacturing a downhole temperature sensor assembly. The method includes mounting a thin-film resistance temperature sensing element to a rigid connection member, electrically connecting thin lead wires of the sensing element to the connection member, and electrically connecting insulated lead wires in attachment apertures in the connection member. Once the foregoing electrical connections are made, the sensor assembly may be sheathed in a high-temperature rated polymer material, such as by heat shrinking the sensing element, the connection member and the insulated lead wires in the polymer material.

DETAILED DESCRIPTION OF THE INVENTION

Figure 1:
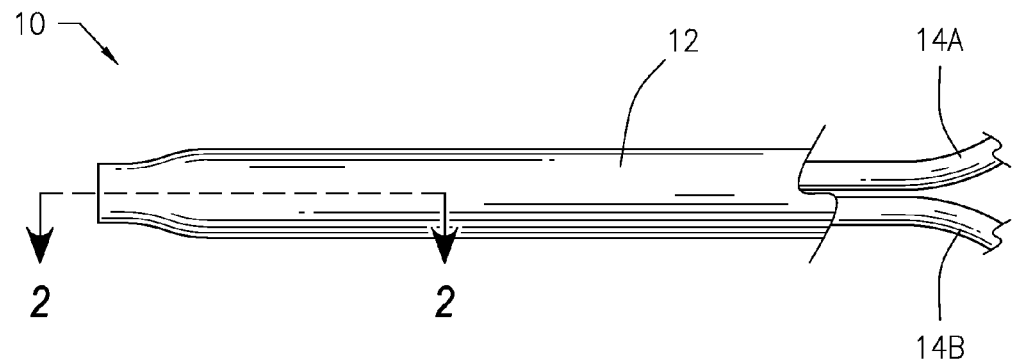
FIG. 1 is a side elevation view of an example of a downhole measurement sensor assembly in accordance with an illustrative embodiment of the invention disclosed herein.
Figure 2:
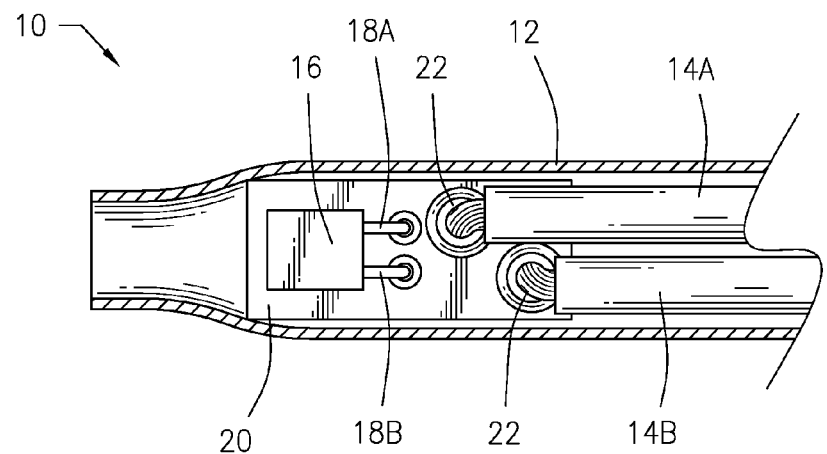
FIG. 2 is a cross-sectional view along line 2-2 of the sensor assembly shown in FIG. 1.

The devices and methods discussed herein are merely illustrative of specific manners in which to make and use this invention and are not to be interpreted as limiting in scope.

While the invention has been described with a certain degree of particularity, it is to be noted that many modifications may be made in the details of the construction and the arrangement of the elements and components of the devices and/or in the sequences and steps of the methods without departing from the scope of this disclosure. It is understood that the devices and methods are not limited to the embodiments set forth herein for purposes of exemplification.

The description of the invention is intended to be read in connection with the accompanying drawings, which are to be considered part of the entire written description of this invention. In the description, relative terms such as "front," "rear," "lower," "upper," "horizontal," "vertical," "above," "below," "up," "down," "top" and "bottom" as well as derivatives thereof (e.g., "horizontally," "downwardly," "upwardly" etc.) should be construed to refer to the orientation as then described or as shown in the drawings under discussion. These relative terms are for convenience of description and do not require that the machine be constructed or the process to be operated in a particular orientation. Terms, such as "connected," "connecting," "attached," "attaching," "join" and "joining" are used interchangeably and refer to one structure or surface being secured to another structure or surface or integrally fabricated in one piece.

Referring to the figures of the drawings, wherein like numerals of reference designate like elements throughout the several views, the invention relates to a downhole measurement sensor assembly 10 for an electrical submersible pump (not shown). The downhole measurement sensor assembly 10 is housed within a rugged, insulated and durable enclosure 12 that is assembled according to the method of manufacture described herein. The sensor assembly 10 is configured to be inserted into a windings area (not shown) of a downhole motor (not shown) of the ESP. The sensor assembly 10 includes insulated lead wires 14A/B that are connected to a thin-film sensing element 16, which has thin lead wires 18A/B that are respectively indirectly electrically connected via a connection member 20 to the insulated lead wires 14A/B. The connection member 20 acts as a rigid substrate and provides for an intermediate means of connecting the fragile thin lead wires 18A/B of the thin-film sensing element 16 and the larger insulated lead wires 14A/B of the sensor assembly 10. The connection member 20 proves two (2) independent connection points, as well as space for physically mounting the associated thin-film sensing element 16. The thin-film sensing element 16 is mounted the connection member 20, and the connection member 20 includes attachment apertures 22 for connecting the insulated lead wires 14A/B.

The ends of the insulated lead wires 14A/B, the thin-film sensing element 16, the thin lead wires 18A/B of the sensing element 16 and the connection member 20 of the sensor assembly 10 are housed within the enclosure 12. The enclosure 12 is constructed of a high-temperature rated, insulated, heat shrinkable polymer material, such as polytetrafluoroethylene (PTFE), which serves as an outer sheath and minimizes the overall diameter of the sensor assembly 10. Multiple layers of polymer material may be utilized if necessary for additional robustness of the enclosure 12; however, because the connection member 20 acts as a rigid substrate and maintains adequate spacing between the connections, the thin lead wires 18A/B and the insulated lead wires 14A/B connections in the sensor assembly 10 do not require additional polymer material to be applied for durability.

For purposes of illustration not limitation, the connection member 20 is a small printed circuit board (PCB) made from a material suitable for high operating temperatures and has nominal dimensions, such as about 0.140 inches wide by about 0.240 inches long by about 0.030 inches thick. The thin-film sensing element 16 may have has a substantially linear relationship of resistance and temperature, thereby allowing the ESP motor temperature to be readily monitored by the sensor assembly 10. The thin-film resistance temperature sensing element 16 may have a nominal resistance of about 1000 ohm at 0° C. The lead wires 14A/B may be AWG 20 with insulation rated at approximately 1000 volts. The enclosure may have an inner diameter of about 0.141 inches, which after heat shrinking, forms a close shroud around the interior component parts of the sensor assembly 10.

The invention also relates to a method of manufacturing the downhole measurement sensor assembly 10 by mounting the thin-film sensing element 16 to the connection member 20 and connecting, such as by soldering, the insulated lead wires 14A/B in the attachment apertures 22. After the two (2) independent electrical connections of the lead wires 14A/B and the thin lead wires 18A/B of the sensing element 16 are made with the connection member 20, the interior component parts of the sensor assembly 10 are enclosed with the high-temperature rated, insulated, polymer material, which is then subjected to heat shrinking in order to house the sensor assembly 10 in the rugged, insulated and durable enclosure 12.

Whereas, the invention has been exemplified for use in a downhole measurement sensor, it should be understood that the invention can be used for any situation where a small, low cost temperature sensor is needed. Moreover, the devices and methods have been described in relation to the drawings and claims, it should be understood that other and further modifications, apart from those shown or suggested herein, may be made within the scope of the invention.

What is claimed is:

1. A downhole temperature sensor assembly configured to be inserted into a windings area of a downhole motor for an electrical submersible pump, said sensor assembly comprising:
   a thin-film temperature sensing element having a pair of thin lead wires;
   a pair of insulated lead wires;
   a rigid connection substrate electrically connected to said thin lead wires of said thin-film sensing element and to said insulated lead wires, wherein said rigid connection substrate is a printed circuit board, and wherein said sensing element is mounted to said printed circuit board; and
   a rugged, insulated and durable enclosure housing said sensing element, an end of said insulated lead wires and said rigid connection member; and said enclosure constructed from a polymer material.

2. The sensor assembly of claim 1 wherein said polymer material is a high-temperature rated, insulated, heat shrinkable polymer material.

3. The sensor assembly of claim 2 wherein said polymer material is polytetrafluoroethylene.

4. The sensor assembly of claim 1 wherein said sensing element is a thin-film resistance temperature sensing element.

5. The sensor assembly of claim 4 wherein said sensing element has a nominal resistance of about 1000 ohm at 0° C.

6. A thin-film resistance temperature sensing device configured to be inserted into a windings area of a downhole motor for an electrical submersible pump, said sensing device comprising:
   a thin-film temperature sensing element having a substantially linear relationship of resistance and temperature, said sensing element mounted to a printed circuit board, said sensing element having thin lead wires electrically connected to said printed circuit board, said printed circuit board having attachment apertures electrically connected to insulated lead wires of said sensing device, and an enclosure constructed of a high-temperature rated polymer material housing said sensing device.

7. The sensing device of claim 6 wherein said polymer material is a high-temperature rated, insulated, heat shrinkable polymer material.

8. The sensing device of claim 7 wherein said polymer material is polytetrafluoroethylene.

9. The sensing device of claim 6 wherein said sensing element has a nominal resistance of about 1000 ohm at 0° C.

10. The sensing device of claim 6 wherein said printed circuit board is about 0.140 inches wide, about 0.240 inches long and about 0.030 inches thick.

* * * * *